US007009864B2

(12) United States Patent  
Madan

(10) Patent No.: US 7,009,864 B2
(45) Date of Patent: Mar. 7, 2006

(54) ZERO CANCELLATION SCHEME TO REDUCE PLATELINE VOLTAGE IN FERROELECTRIC MEMORY

(75) Inventor: Sudhir Kumar Madan, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 218 days.

(21) Appl. No.: 10/748,041

(22) Filed: Dec. 29, 2003

(65) Prior Publication Data

US 2005/0146913 A1 Jul. 7, 2005

(51) Int. Cl.
  *G11C 11/22* (2006.01)
(52) U.S. Cl. .................. 365/145; 365/189.09; 365/149
(58) Field of Classification Search ...................... None
  See application file for complete search history.

(56) References Cited

U.S. PATENT DOCUMENTS

| | | | | |
|---|---|---|---|---|
| 5,572,459 | A | * | 11/1996 | Wilson et al. .............. 365/145 |
| 6,046,928 | A | | 4/2000 | Takata |
| 6,208,550 | B1 | | 3/2001 | Kim |
| 6,487,103 | B1 | | 11/2002 | Yamamoto et al. |
| 6,493,251 | B1 | | 12/2002 | Hoya et al. |
| 6,510,073 | B1 | | 1/2003 | Lee et al. |
| 6,661,697 | B1 | | 12/2003 | Yamamoto et al. |
| 6,667,896 | B1 | | 12/2003 | Rickes et al. |
| 2003/0031042 | A1 | | 2/2003 | Yamamoto et al. |
| 2003/0103372 | A1 | | 6/2003 | Matsushita |
| 2003/0174532 | A1 | | 9/2003 | Matsushita et al. |
| 2003/0206430 | A1 | | 11/2003 | Ho |

OTHER PUBLICATIONS

"A Bit-Line GND Sense Technique for Low-Voltage Operation FeRAM", Shoichiro Kawashima, Toru Endo, Akira Yamamoto, Ken'ichi Nakabayashi, Mitsuharu Nakazawa, Keizo Morita and Masaki Aoki, 2001 Symposium on VLSI Circuits Digest of Technical Papers, pp. 127 & 128.

"A Survey of Circuit Innovations in Ferroelectric Random-Access Memories", Ali Sheikholeslami and P. Glenn Gulak, Proceedings of the IEEE, vol. 88, No. 5, May 2000, pp. 667-689.

U.S. Appl. No. 10/717,146, Madan, filed Nov. 18, 2003.
U.S. Appl. No. 10/805,809, Madan et al., filed Mar. 22, 2004.
U.S. Appl. No. 10/847,412, Summerfelt et al., filed May 17, 2004.
U.S. Appl. No. 10/866,834, Madan et al., filed Jun. 14, 2004.

* cited by examiner

*Primary Examiner*—David Lam
(74) *Attorney, Agent, or Firm*—Jacqueline J. Garner; W. James Brady, III; Frederick J. Telecky, Jr.

(57) ABSTRACT

Ferroelectric memory devices and methods are provided, wherein a cell plateline signal is applied to a ferroelectric target cell capacitor and a zero cancellation capacitor is coupled with a bitline during a memory read operation. A negative pulse is applied to the zero cancellation capacitor during the cell plateline pulse to reduce the voltage on the bitline, thereby facilitating reduced cell plateline voltage levels while still allowing a high percentage of the ferroelectric saturation voltage to be applied across the ferroelectric cell capacitor.

49 Claims, 11 Drawing Sheets

ZERO CANCELLATION SCHEME TO REDUCE PLATELINE VOLTAGE IN FERROELECTRIC MEMORY

FIELD OF INVENTION

The present invention relates generally to semiconductor devices and more particularly to improved apparatus and methods for reduced plateline voltages in ferroelectric memory devices.

BACKGROUND OF THE INVENTION

In semiconductor memory devices, data is read from or written to memory cells in the device according to decoded address information and various other control signals. Such memory devices are used for storage of data and/or program code in personal computer systems, embedded processor-based systems, video image processing circuits, communications devices, and the like. Ferroelectric memories store data in ferroelectric capacitors, and are commonly organized in single-transistor, single-capacitor (1T1C) or two-transistor, two-capacitor (2T2C) configurations. In a folded bitline 1T1C architecture, the individual ferroelectric memory cells typically include a ferroelectric (FE) capacitor adapted to store a binary data bit, together with a MOS access transistor, which operates to selectively connect the FE capacitor to one of a pair of complementary bitlines, with the other bitline being connected to a reference voltage for read operations. The individual cells are commonly organized as individual bits of a corresponding data word, where the cells of a given word are accessed concurrently by activation of platelines and wordlines by address decoding control circuitry.

Ferroelectric memory devices provide non-volatile data storage where the cell capacitors are constructed using ferroelectric dielectric material which may be polarized in one direction or another in order to store a binary value. The ferroelectric effect allows for the retention of a stable polarization in the absence of an applied electric field due to the alignment of internal dipoles within Perovskite crystals in the ferroelectric material. This alignment may be selectively achieved by application of an electric field that exceeds the coercive field of the material. Conversely, reversal of the applied field reverses the internal dipoles. The response of the polarization of a ferroelectric capacitor to the applied voltage may be plotted as a hysteresis curve.

Data in a ferroelectric data cell is read by connecting a reference voltage to a first bitline and connecting the cell capacitor between a complementary bitline and a plateline signal. This provides a differential voltage on the bitline pair, which is connected to a differential sense amp circuit. The reference voltage is typically supplied at an intermediate voltage between the voltage associated with a capacitor storing a binary "0" and that of the capacitor storing a binary "1". The polarity of the sensed differential voltage thus represents the data stored in the cell, which is buffered by the sense amp and provided to a pair of local IO lines. The transfer of data between the ferroelectric memory cell, the sense amp circuit, and the local data bitlines is controlled by various access transistors, typically MOS devices, with switching signals being provided by control circuitry including address decoders and timing circuits in the device.

Connection of the ferroelectric cell capacitor between the plateline pulse and the bitline during a read operation causes an electric field to be applied to the cell capacitor. If the field is applied in a direction to switch or reverse the internal dipoles, more charge will be moved than if the dipoles are not reversed. As a result, the sense amplifier can measure the charge applied to the cell bitlines and produce either a logic "1" or "0" differential voltage at the sense amp terminals. Since reading the cell data is a destructive operation, the sensed data is then restored to the cell following each read operation. To write data to the cell, an electric field is applied to the cell capacitor by a sense amp or write buffer to polarize it to the desired state. Ferroelectric memories provide certain performance advantages over other forms of non-volatile data storage devices, such as flash and EEPROM type memories. For example, ferroelectric memories offer short programming (e.g., write access) times and low power consumption.

Ferroelectric memory devices typically include a number of individually addressable memory cells arranged in an array configuration, wherein the array is typically organized as a matrix of rows and columns. Conventionally, data is stored into a memory array as a row, and read out from the memory array as a row, where the row typically consists of 8, 16, 32, or 64 bits of binary data. During a write operation, row decoder control circuitry provides a plateline pulse signal to the first sides of the ferroelectric cells in a data row, the other sides of which are connected to the array bitlines to receive the data. In a read operation, the decoder provides plateline pulses to the first side of each ferroelectric memory cell in a data row, and sense amplifiers are connected to the other side of the cells to sense a row of stored data bits in parallel fashion. Thus, in a single read operation, an entire row of data bits (e.g., 8, 16, 32, or 64 bits) are obtained from the memory cells in the selected row.

FIG. 1A illustrates a portion of a ferroelectric memory device 2 organized in a folded bitline architecture, having 512 rows (words) and 64 columns (bits) of data storage cells $C_{ROW-COLUMN}$, where each column of cells is accessed via a pair of complementary bitlines $BL_{COLUMN}$ and $BL_{COLUMN}'$. In the first row of the device 2, for example, the cells C1-1 through C1-64 form a 64 bit data word accessible via a wordline WL1 and complementary bitline pairs BL1/BL1' through BL64/BL64'. The cell data is sensed during data read operations using sense amp circuits 12 (S/A C1 through S/A C64) associated with columns 1 through 64, respectively. In the illustrated configuration, the 1T1C cells $C_{ROW-COLUMN}$ individually include a single ferroelectric cell capacitor and an access transistor to connect the cell capacitor between one of the complementary bitlines associated with the cell column and a plateline, where the other bitline is selectively connected to a reference voltage generator 8 or 8' via one of a pair of switches 8a, 8b, depending upon which word is being accessed for read operations.

In the device 2, cells along WL1 and WL2 (as well as those along WL5, WL6, WL9, WL10, . . . , WL509, WL510) are coupled with bitlines BL1–BL64, whereas cells along WL3 and WL4 (as well as those along WL7, WL8, WL11, WL12, . . . , WL511, WL512) are coupled with bitlines BL1'–BL64'. In reading the first data word along the wordline WL1, the cells C1-1 through C1-64 are connected to the sense amps via the bitlines BL1, BL2 . . . , BL63, and BL64 while the complementary reference bitlines BL1', BL2' . . . , BL63', and BL64' are connected to the reference voltage generators 8, 8'.

FIGS. 1B and 1C illustrate a single cell 6a (e.g., cell C1-1) in the device 2, which is coupled to bitline BL1, wordline WL1, and plateline PL1, as well as a timing diagram 20 showing waveforms or signals on various nodes during a read operation in the device 2. The 1T1C cell 6a includes a ferroelectric (FE) capacitor $C_{FE}1$ and a MOS access transistor 10a, where the capacitor $C_{FE}1$ is coupled between the transistor 10a and a plateline signal PL1, and the transistor 10a is coupled between the capacitor $C_{FE}1$ and the bitline BL1. Also illustrated is a corresponding sense amp 12 (S/A C1) coupled to the bitline BL1. During a read operation in the device 2, a signal level $V_1$ or $V_0$ is obtained on the array bitline BL1, depending upon the state of the data being read (e.g., binary "1" or "0", respectively). A reference voltage $V_{REF}$ from the shared reference generators 8, 8' is ideally between $V_1$ and $V_0$, which is then applied to the complementary bitline BL1' (e.g., the other input to the sense amp 12).

To read the data stored in the ferroelectric capacitor $C_{FE}1$, typically the access transistor 10a is turned on by applying a voltage Vwl which is greater or equal to Vdd plus the threshold voltage of the transistor 10a via the wordline WL1 to couple the bitline BL1 to the capacitor $C_{FE}1$, and the plateline PL1 is thereafter pulsed high, as illustrated in FIG. 1C. This causes charge sharing between the ferroelectric capacitor $C_{FE}1$ and the bitline BL1 (e.g., bitline BL1 has a non-zero capacitance associated therewith, not shown), whereby the bitline voltage BL1 rises, depending upon the state of the cell data being read. To sense the cell data, the plateline PL1 is returned to 0V and the sense amp 12 is activated (e.g., via a sense amp enable signal SE). One input terminal of the sense amp 12 is coupled to the cell bitline (e.g., data bitline BL1) and the other differential sense amp input is coupled to a reference voltage (e.g., reference bitline BL1' in this example). In the example of FIGS. 1A–1C, the sense amp 12 is enabled after the plateline signal PL1 is again brought low, a technique referred to as "pulse sensing". Alternatively, "step sensing" can be used in the device 2, in which the sense amp is enabled via the SE signal while the plateline pulse PL1 is still high.

To optimize the signal level transferred from the capacitor $C_{FE}1$ to the bitline BL1 in a read operation, the plateline voltage PL1 should be high enough to ensure that the voltage across the capacitor $C_{FE}1$ is greater than about 90% of the saturation voltage value for the ferroelectric capacitor $C_{FE}1$. For example, where the saturation value of the capacitor $C_{FE}1$ is about 1.1 V, the voltage across the capacitor $C_{FE}1$ should be about 1 V or more during the read operation. If the voltage across capacitor $C_{FE}1$ is insufficient, the signal level strength at the sense amp 12 is weakened and the signal margin or sensing capability of the sense amp 12 suffers.

As can be seen in FIG. 1C, the bitline voltage BL1 is non-zero once the plateline signal pulse PL1 has been applied to the capacitor $C_{FE}1$, due to charge from the capacitor $C_{FE}1$ being transferred to the bitline BL1 and the capacitance thereof. In one example, the bitline voltage BL1 can be of the order of 300–500 mV during the time that PL1 is high. For instance, where the ferroelectric capacitor $C_{FE}1$ has a saturation voltage of about 1.1 V, the bitline voltage BL1 rises to around 300 mV when reading a "0" data state, and to around 500 mV when reading a "1" data state during the time that PL1 is high. When the plateline PL1 is brought low, the bitline voltage BL1 reduces to around 50 mV for a "0" data state and to around 200 mV for a "1" data" state (e.g., in a range generally between about 25 and 250 mV). In this example, the reference voltage is about halfway between the "0" and "1" states, such as about 125 mV.

Because the voltage across the capacitor $C_{FE}1$ during the plateline pulse PL1 is the difference between the plateline pulse level PL1 and the bitline voltage on BL1, the plateline pulse signal PL1 itself needs to be much higher than the saturation voltage of the capacitor $C_{FE}1$, due to the non-zero bitline voltage. In the above example, the plateline pulse on PL1 in the device 2 needs to be about 1.5 V, in order to provide 1 V across the capacitor $C_{FE}1$ during the read operation. For low power devices, however, the supply level Vdd may not be this high. For example, if the device 2 operates at a supply level Vdd of only 1.3 V, the 1.5 V plateline pulse for PL1 must be generated by a charge pump circuit (not shown) or other voltage boosting circuitry.

Since the saturation voltage of a ferroelectric capacitor is dependent upon the ferroelectric material thereof, redesigning the device 2 for lower threshold ferroelectric capacitors is difficult, involving process integration issues related to processing a different material. Another shortcoming of conventional ferroelectric memories is designing the 1.5 V volt driver circuits for the plateline PL1 using 1.3 V transistors. Moreover, the provision of special high voltages for plateline pulses also increases the device area and cost, and can degrade device reliability. Thus, there is a need for improved ferroelectric memory devices and memory read techniques by which plateline voltage levels can be reduced for a given ferroelectric capacitor material type, without the need for voltage boost circuits.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The present invention involves coupling a negative charge to a memory array bitline through a zero cancellation capacitor while the cell plateline signal is applied during a read operation. This will reduce the bitline voltage when the cell plateline signal is high and hence will allow more of the plateline voltage to be applied across the ferroelectric cell capacitor. As a result, the cell plateline voltage requirement can be reduced, while still providing a high percentage of the saturation voltage across the ferroelectric cell capacitor during read operations. Before the cell plateline signal is removed, a positive charge is then applied to the bitline. In one example illustrated and described below, a negative pulse of a pre-determined magnitude is applied to the zero cancellation capacitor during the positive cell plateline pulse, in order to provide the negative charge and positive charge to the bitline. The negative pulse may be a low-going signal (e.g., a 2-level signal) or may comprise three pre-determined levels, with the first and third levels being greater than the second level. The invention thus allows the use of reduced cell plateline voltage levels while maintaining proper ferroelectric capacitor pulsing during read operations, without requiring voltage boost circuits to generate the cell plateline pulse. For example, in a 1.3 V device, the conventional memory above required a high current 1.5 V supply in order to generate the cell plateline pulse, whereas the present invention facilitates use of 1.3 V cell plateline pulses, by which significant circuit area can be saved and power consumption can be reduced.

One aspect of the invention provides a method of reading data from a ferroelectric memory cell. The method comprises coupling a first ferroelectric cell capacitor terminal to an array bitline, activating a cell plateline signal to a second ferroelectric cell capacitor terminal to create a voltage across the cell capacitor, and coupling a first zero cancellation capacitor terminal to the bitline while the plateline signal is provided to the ferroelectric cell capacitor. A zero cancellation plateline signal is applied to a second zero cancellation capacitor terminal while the cell plateline signal is activated to the ferroelectric cell capacitor, to reduce the bitline voltage. In one implementation, the zero cancellation plateline signal comprises a negative pulse, applied as a first pre-determined voltage level during a first time period and a second pre-determined voltage level during a second time period, where the first voltage level is greater than the second voltage level. In another implementation, the zero cancellation plateline signal further comprises a third pre-determined voltage level during a third time period, which is greater than the second voltage level. As used herein, pre-determined voltage levels are any voltage levels that are independent of the data being read from the ferroelectric memory cell, for example, wherein the pre-determined voltage levels are the same for reading both "0" and "1" stored data states. In the example illustrated and described below, the first and third pre-determined voltage levels are equal, and the first, second, and third pre-determined voltage levels are positive, although other levels and polarities are possible within the scope of the invention. After the zero cancellation plateline signal is applied, a voltage can be sensed on the array bitline, for example, after the second time period, wherein the invention may be employed in pulse sensing or step sensing systems.

Another aspect of the invention provides ferroelectric memory devices and zero cancellation systems therefor, that facilitate data read operations using reduced plateline voltages. The zero cancellation system comprises a zero cancellation capacitor, such as a ferroelectric capacitor, having first and second terminals, and a zero cancellation switching device, such as a transistor coupled with the zero cancellation capacitor. The switching device selectively couples the zero cancellation capacitor with an array bitline according to a zero cancellation wordline signal. The system further comprises a control system that provides the zero cancellation wordline signal and provides a negative pulse to the zero cancellation capacitor while a cell plateline signal is activated. A zero cancellation discharge switching device may be provided to selectively couple the zero cancellation capacitor node to be coupled to a bitline to zero volts prior to the negative pulse.

The following description and annexed drawings set forth in detail certain illustrative aspects and implementations of the invention. These are indicative of only a few of the various ways in which the principles of the invention may be employed.

DETAILED DESCRIPTION OF THE INVENTION

Figure 1A:
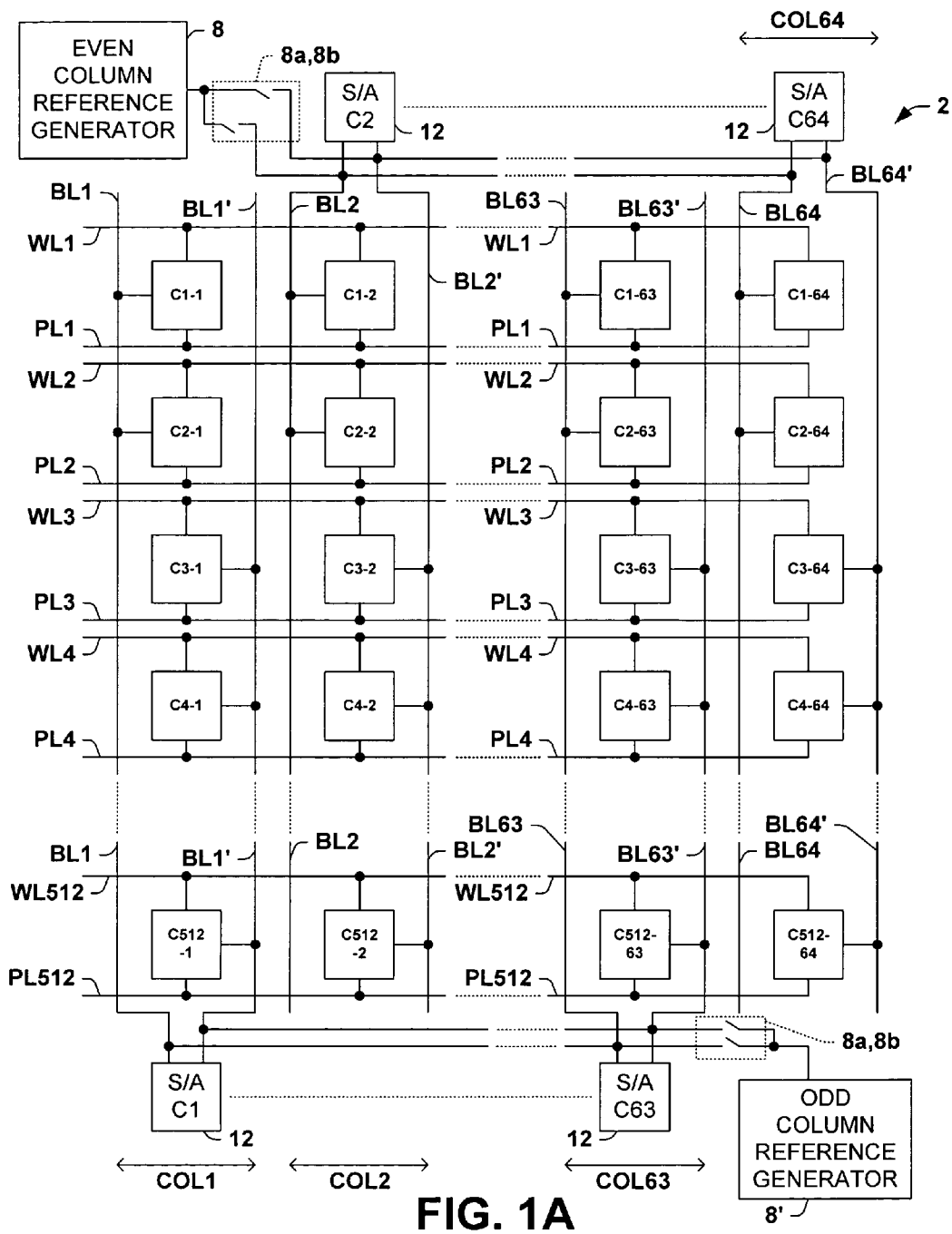
FIG. 1A is a schematic diagram illustrating a portion of a conventional 1T1C folded bitline ferroelectric memory device.
Figure 1B:
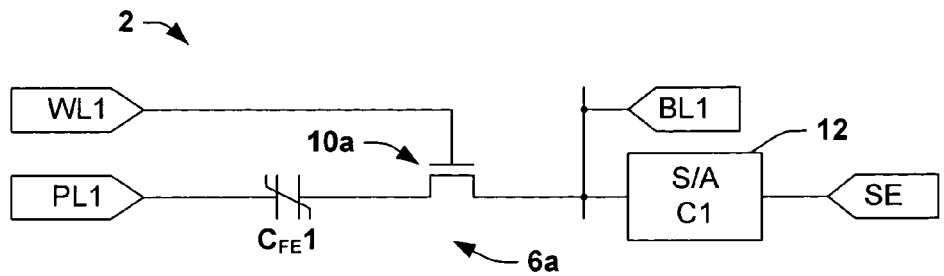
FIG. 1B is a schematic diagram illustrating a 1T1C cell and an associated sense amp in the device of FIG. 1A.
Figure 1C:
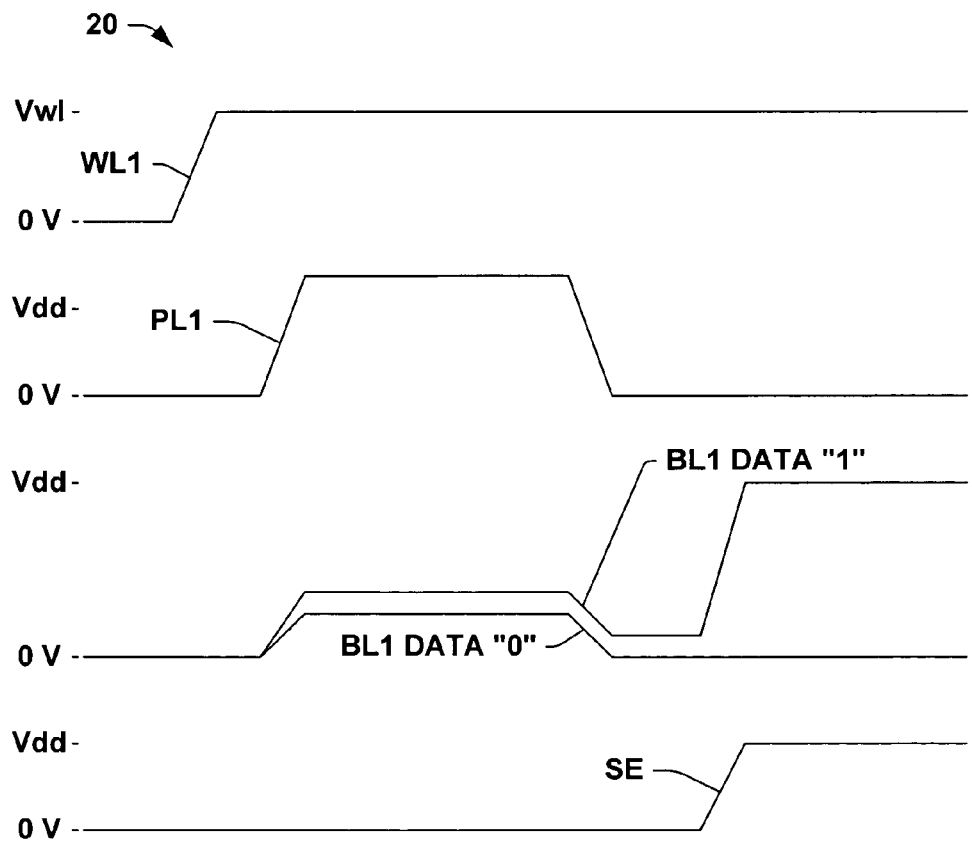
FIG. 1C is a waveform diagram illustrating operation of the cell of FIGS. 1A and 1B during a conventional read operation.

One or more implementations of the present invention will now be described with reference to the attached drawings, wherein like reference numerals are used to refer to like elements throughout. The invention relates to ferroelectric memory devices and methods for reading ferroelectric cell data, in which negative and positive charges are applied to an array bitline during a read operation, to selectively lower the bitline voltage during a portion of the cell plateline pulse. This allows reduced cell plateline voltage levels, and thus facilitates reduced power consumption and elimination of the voltage booster circuitry used in conventional ferroelectric memory devices. One or more exemplary implementations are hereinafter illustrated and described in the context of folded bitline type ferroelectric memory architectures using single transistor-single capacitor (e.g., 1T1C) cells. However, the invention is not limited to the illustrated implementations, and may alternatively be employed with other cell types (e.g., 2T2C) and/or in other array architectures.

Figure 2A:
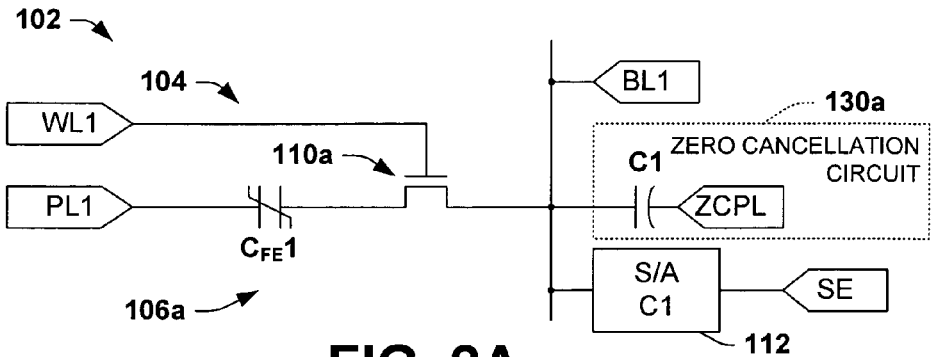
FIG. 2A is a schematic diagram illustrating a 1T1C ferroelectric memory cell with an associated sense amp, as well as an exemplary zero cancellation circuit in a folded bitline ferroelectric memory device in accordance with one or more aspects of the present invention.
Figure 2B:
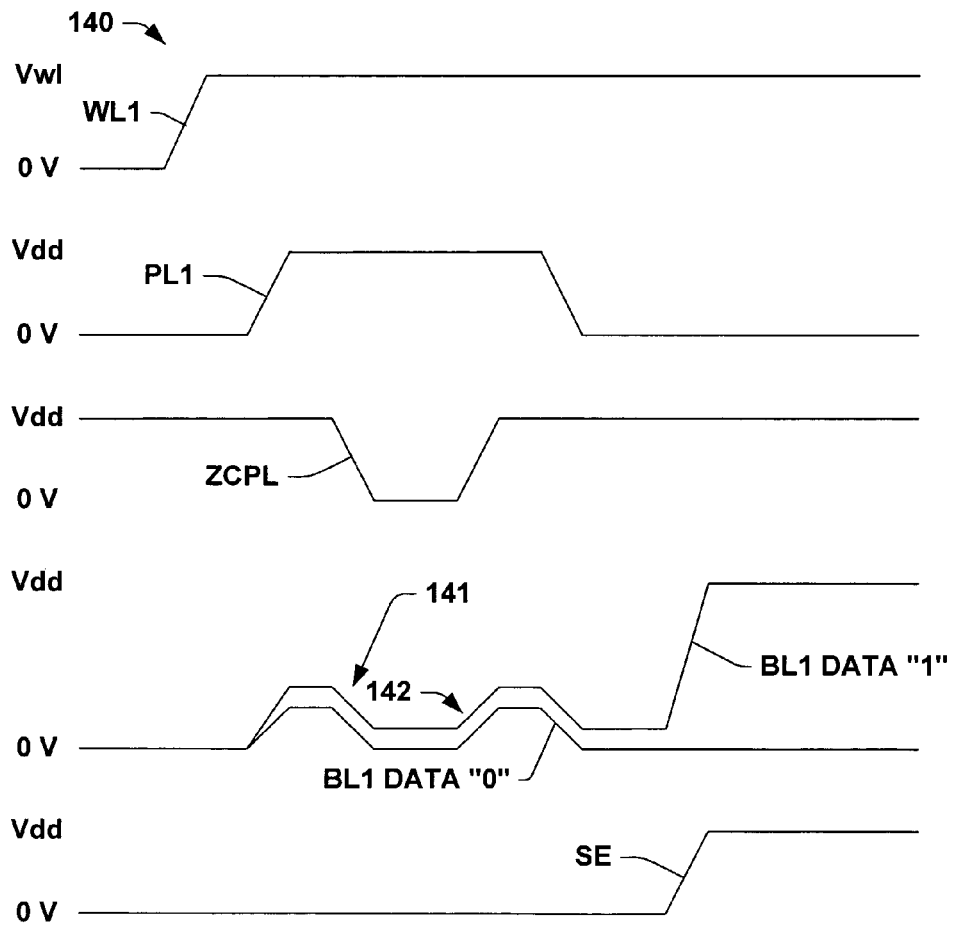
FIG. 2B is an exemplary waveform diagram illustrating operation of the cell of FIG. 2A during a read operation.

Referring initially to FIGS. 2A and 2B, a portion of an exemplary 1T1C folded bitline memory array 104 is illustrated in a memory device 102. FIG. 2A illustrates an exemplary 1T1C cell 106a and a corresponding zero cancellation circuit 130a along a bitline BL1, and FIG. 2B illustrates a waveform diagram 140 in the device 102 during a read operation in accordance with the invention. The cell 106a comprises a ferroelectric cell capacitor $C_{FE}1$ having a first terminal coupled with a cell transistor 110a and a second terminal coupled to receive a cell plateline signal pulse PL1 activated by a control system (e.g., control circuit 122 of FIG. 3F below). The cell transistor 110a selectively couples the cell capacitor $C_{FE}1$ to the bitline BL1 that extends along a column in the array 104 according to an array wordline WL1 from the control system. The wordline and plateline signals WL1 and PL1 are selectively provided by the control system 122 (FIG. 3F) to access a target row of data cells according to decoded address information for read, write, and restore operations in the device 102. Sense amps 112 are coupled with bitlines along columns of the array 104 for reading (e.g., sensing) and writing cell data, wherein one terminal of a first sense amp S/A C1 112 is coupled with the bitline BL1, and another terminal (not shown) is coupled with a complementary bitline BL1' (e.g., as further illustrated in FIGS. 3A–3C below).

According to an aspect of the invention, the device 102 comprises a zero cancellation system 130, including a first zero cancellation circuit 130a for selectively reducing the voltage on the bitline BL1 during read operations. The zero cancellation circuit 130a comprises a zero cancellation capacitor C1 having a first terminal coupled with the bitline BL1 and a second terminal coupled with a zero cancellation plateline signal ZCPL activated by the control system, wherein the capacitor C1 may, but need not be a ferroelectric capacitor, which can be similar or identical to cell ferroelectric capacitor structure and layout. As illustrated and described in FIGS. 3A–3G below, the zero cancellation circuit 130a may also comprise a zero cancellation switching device, such as a transistor to selectively couple the capacitor C1 with the bitline BL1 according to a zero cancellation wordline signal from the control system. In the simplified illustration of FIG. 2A, the capacitor C1 is shown as being connected between the ZCPL signal and the array bitline BL1 for providing zero cancellation charging of the bitline BL1 according to the invention.

FIG. 2B illustrates operation of the cell 106a and the zero cancellation circuit 130a during a memory read operation, wherein the control system (e.g., control circuit 122 in FIG. 3F below) provides the signals WL1, PL1, ZCPL, and a sense amp enable signal SE as illustrated in the diagram 140. In the read operation, the control system activates the cell plateline signal by providing a positive pulse on the cell plateline PL1 after the cell capacitor $C_{FE}1$ is coupled with the bitline BL1 via the cell wordline signal WL1. While the cell plateline PL1 is high, a negative going pulse ZCPL is applied to the zero cancellation capacitor C1 via a zero cancellation plateline signal from the control system. As ZCPL is brought low, negative charge is introduced through the capacitor C1 into the bitline BL1 and the bitline voltage at BL1 is decreased at 141 in FIG. 2B, thereby increasing the voltage across the ferroelectric cell capacitor $C_{FE}1$. This allows a lower cell plateline signal voltage PL1 (e.g., Vdd in this example), whereby the cell plateline pulse PL1 need not be higher than the supply voltage (e.g., no voltage boost circuitry is required).

The zero cancellation plateline signal ZCPL is then brought high, thereby introducing a positive charge to the bitline BL1, which in turn raises the bitline voltage at 142 in FIG. 2B. The cell plateline PL1 is then deactivated (e.g., brought low again) and the sense amp is enabled via the SE signal to begin sensing operation. The example illustrated in FIG. 2B provides pulse sensing wherein the plateline PL1 is deactivated prior to the sense amp enable signal SE, although the invention may be alternatively employed in step sensing systems in which the sense amp 112 is enabled via SE going high prior to the plateline PL1 being deactivated.

Figure 3A:
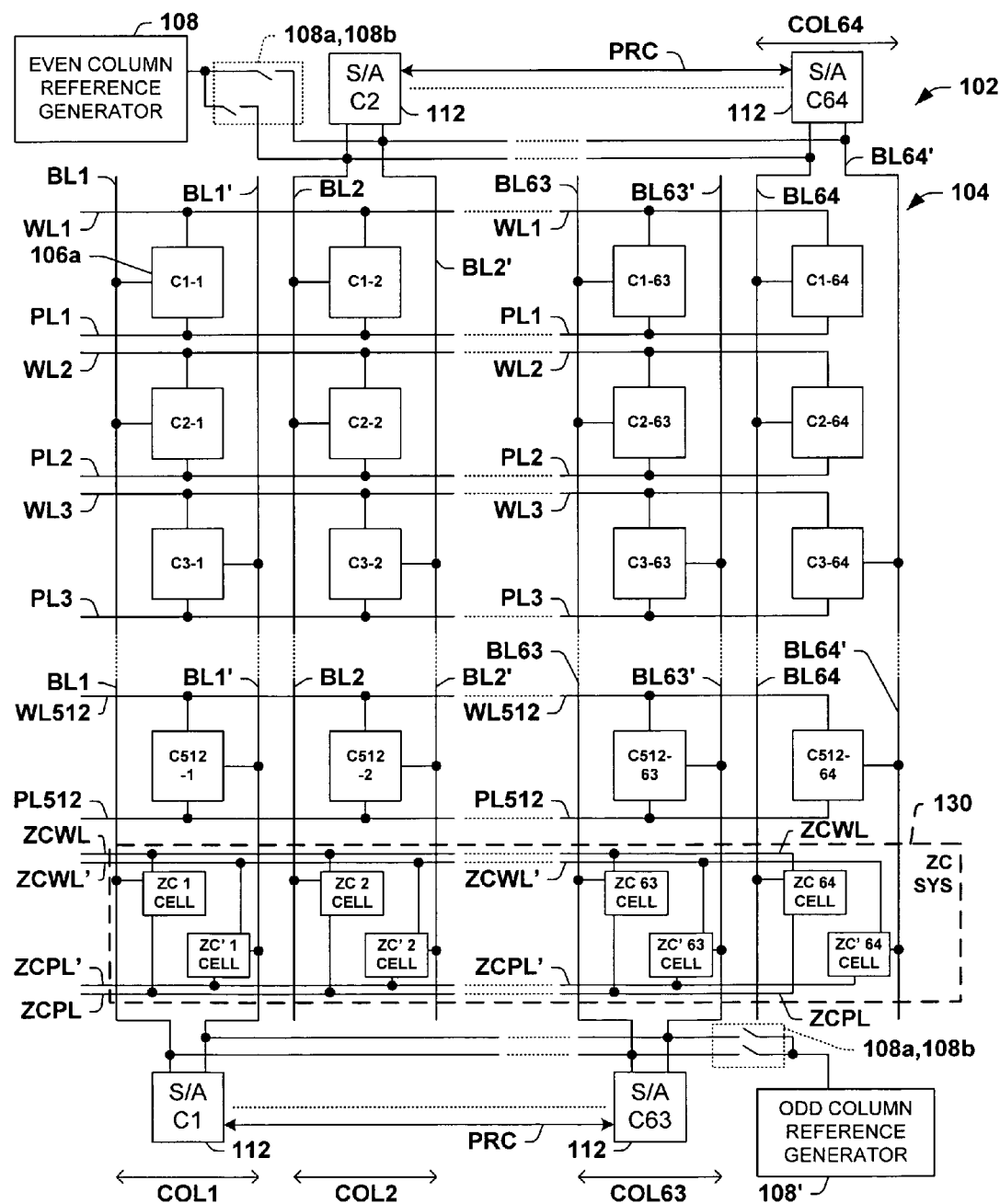
FIGS. 3A–3G are schematic and waveform diagrams further illustrating the exemplary ferroelectric memory device of FIGS. 2A and 2B.
Figure 3B:
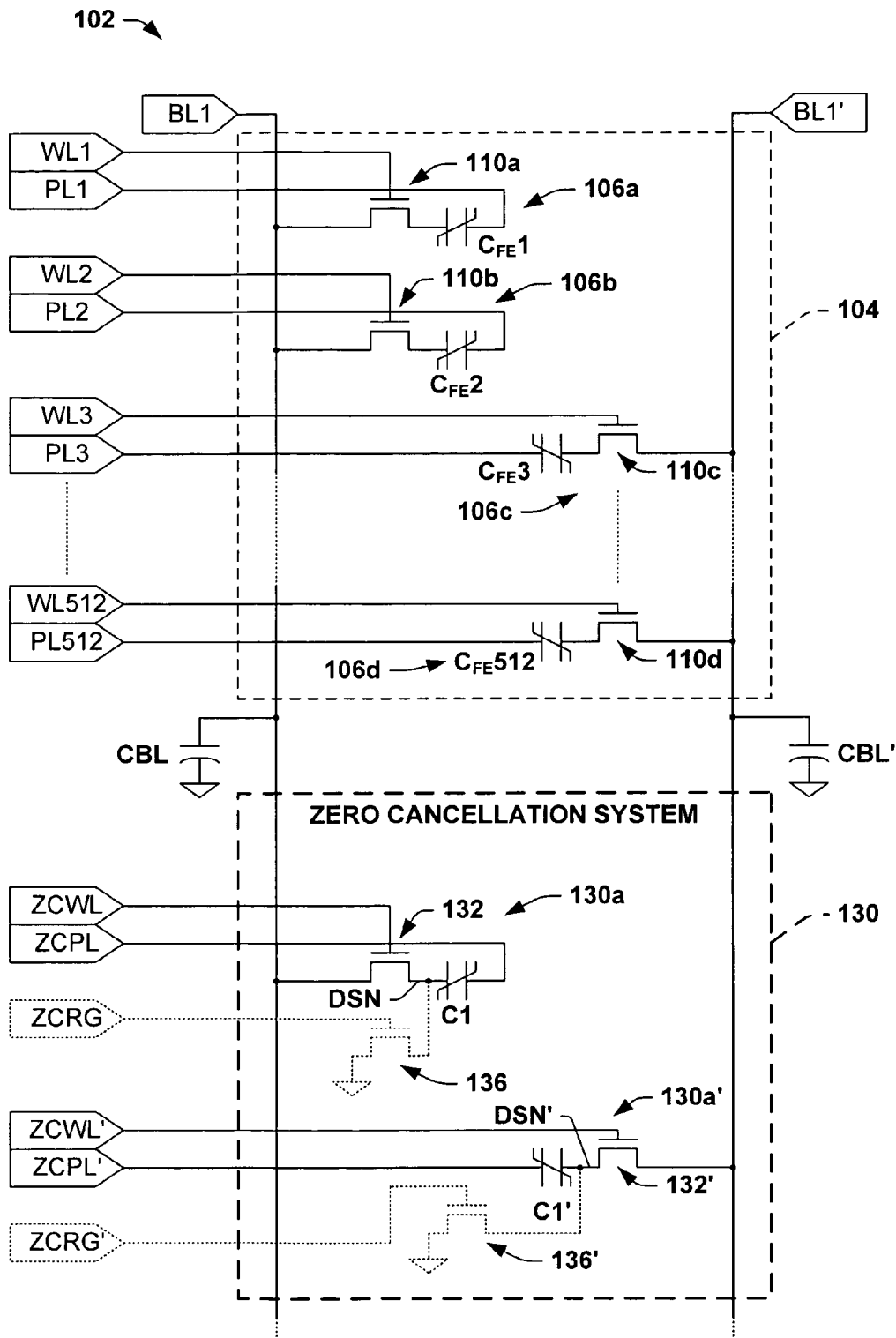
Figure 3C:
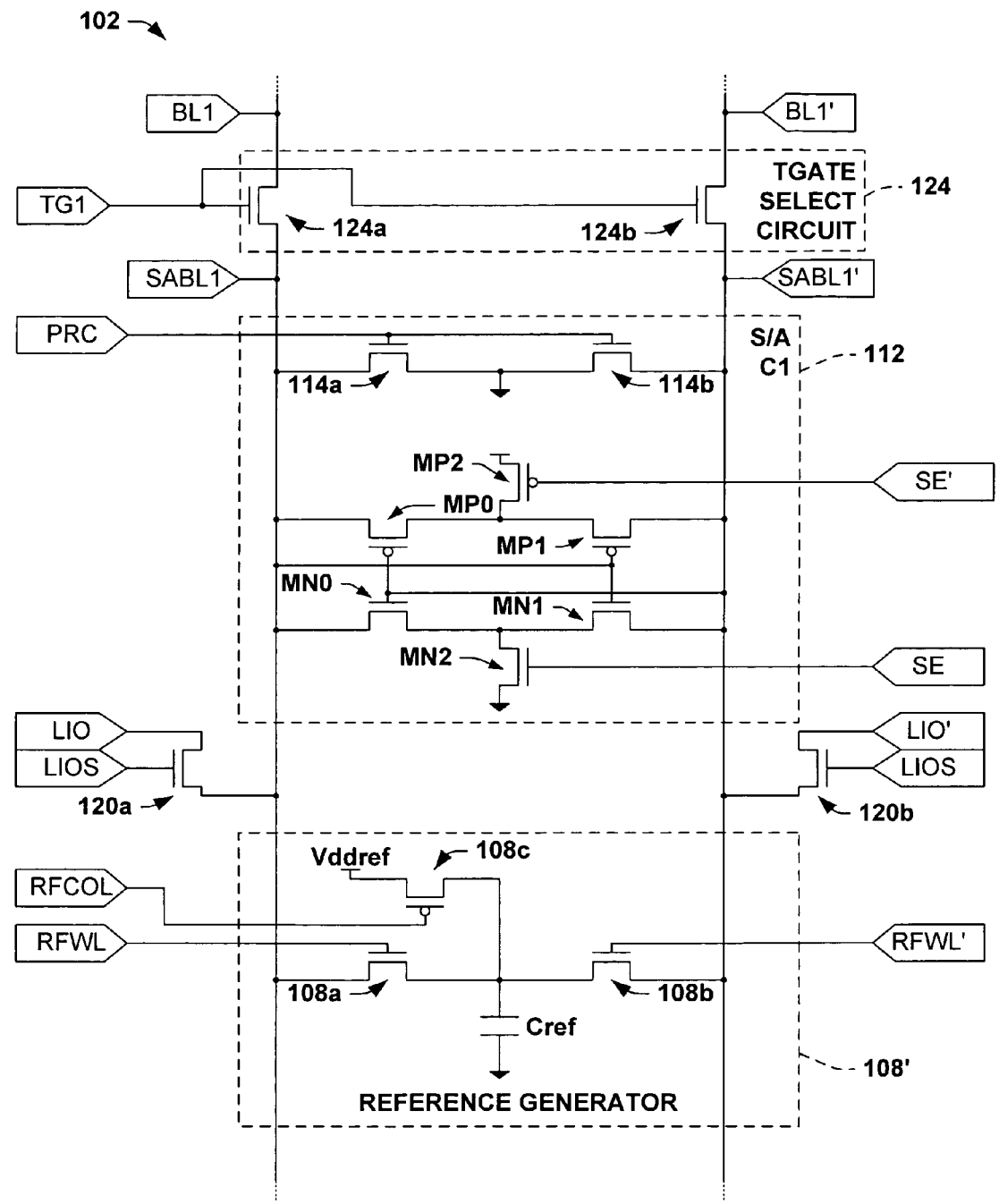
Figure 3D:
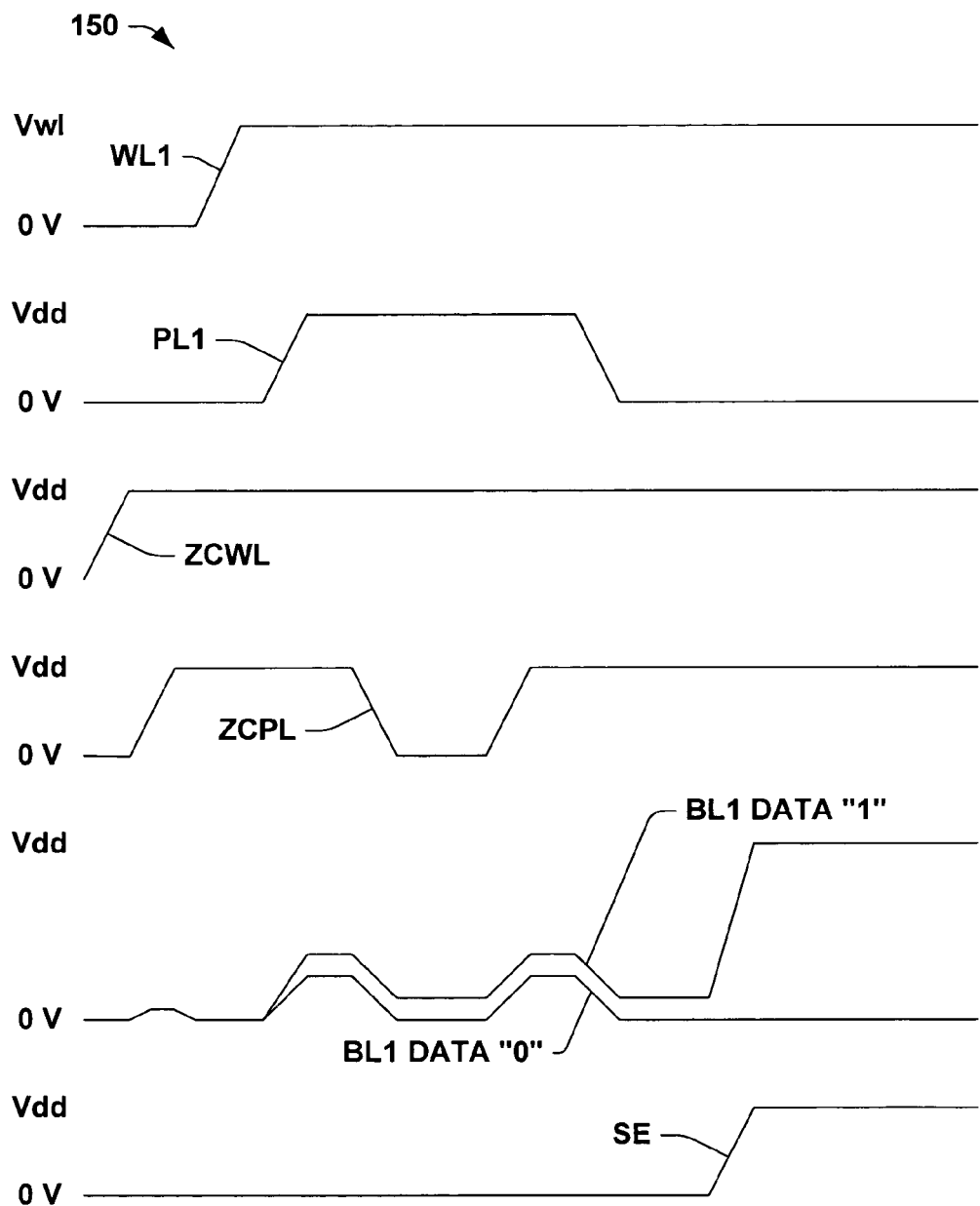
Figure 3E:
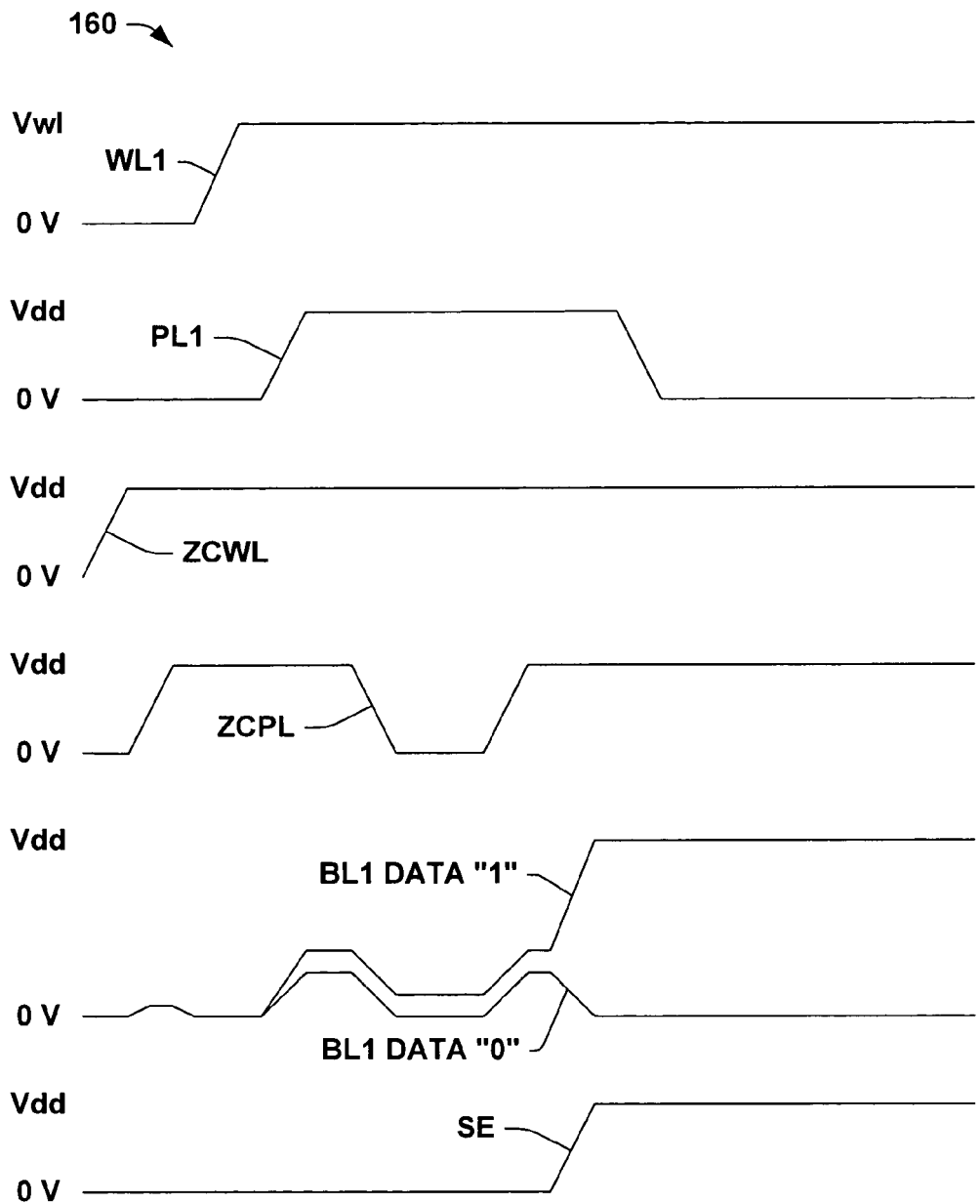
Figure 3F:
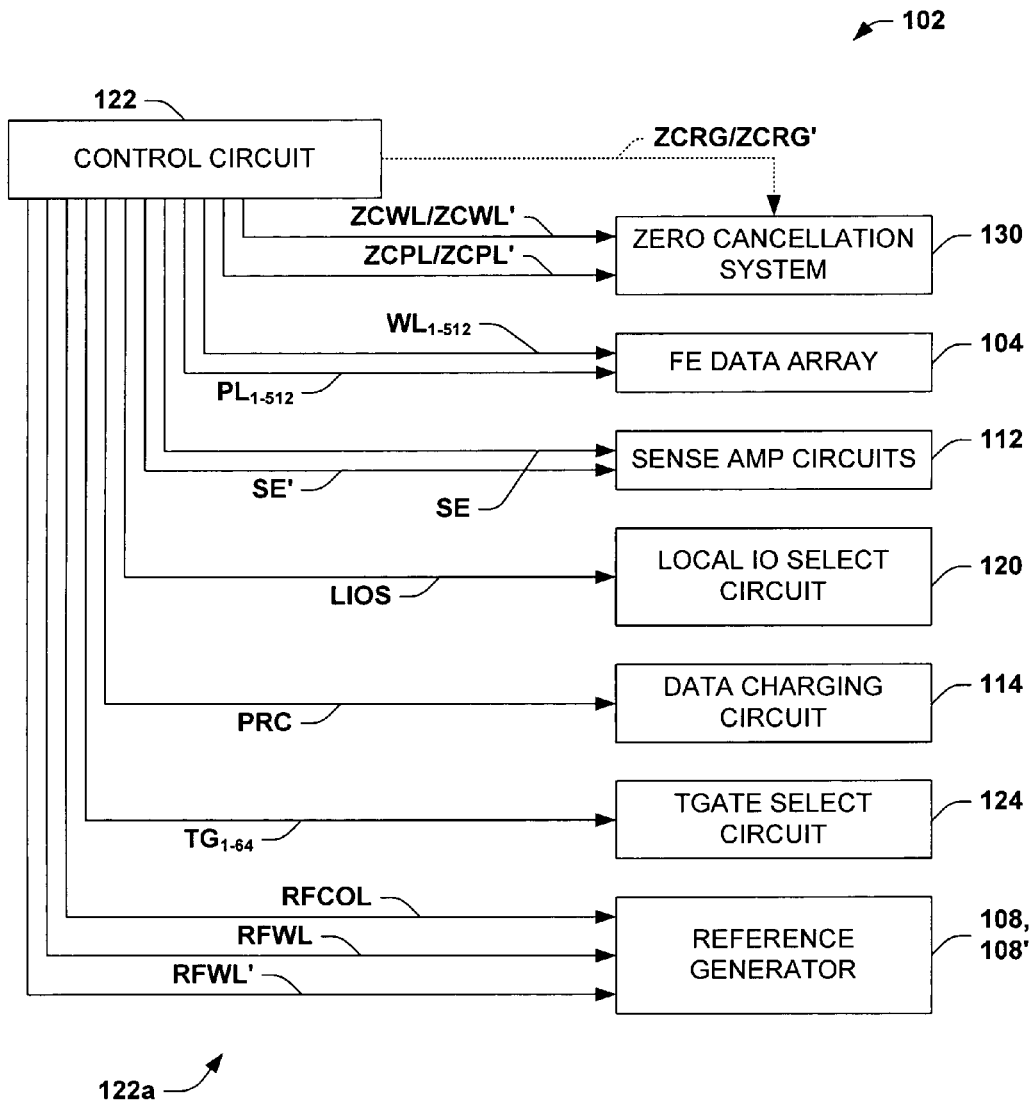

Referring also to FIGS. 3A–3C and 3F, further details of the exemplary ferroelectric memory device 102 are illustrated. As seen in FIG. 3A, the device 102 comprises a folded bitline ferroelectric memory array 104, reference generators 108 and 108' coupled with the bitlines of the array 104 via switches 108a and 108b, and sense amps 112. TGATE select circuits 124 are provided to selectively couple the sense amps 112 with bitlines of the array 104, and a zero cancellation system 130 is provided in the device 102 in accordance with the invention. The ferroelectric memory array 104 comprises 1T1C ferroelectric data memory cells 106 organized in rows along wordlines WL1–WL512 and columns along complementary data bitline pairs BL/BL' in a folded bitline configuration, wherein the wordlines WL1–WL512 and other control and timing signals 122a are provided by a control circuit 122 (FIG. 3F).

In the exemplary array 104, the memory cells along WL1 and WL2 (as well as those along WL5, WL6, WL9, WL10, . . . , WL509, WL510) are coupled with bitlines BL1–BL64, whereas cells along WL3 and WL4 (as well as those along WL7, WL8, WL11, WL12, . . . , WL511, WL512) are coupled with the complementary bitlines BL1'–BL64'. In reading the first data word along the wordline WL1, the cells C1-1 through C1-64 are connected to the sense amps via the bitlines BL1, BL2 . . . , BL63, and BL64 while the complementary reference bitlines BL1', BL2' . . . , BL63', and BL64' are connected to the reference voltage generators 108, 108'. The wordline numbering of the device 102 is exemplary only, wherein other implementations are possible within the scope of the invention.

FIGS. 3B and 3C illustrate further details of the first column along the data bitline pair BL1/BL1' in the array 104, including a portion of the exemplary zero cancellation system 130 of the invention. Several exemplary ferroelectric memory data cells 106a–106d are illustrated in FIG. 3B comprising ferroelectric capacitors $C_{FE}1$–$C_{FE}512$ and MOS cell access transistors 110a–110d configured in a column along the bitlines BL1 and BL1'. The exemplary ferroelectric data memory array 104 comprises an integer number "n" of such columns, for example, 64 columns in the illustrated device 102. The ferroelectric cell capacitors $C_{FE}$ of the data array 104 may be fabricated from any appropriate ferroelectric material in a wafer, such as Pb(Zr,Ti)O3 (PZT), (Ba,Sr)TiO3 (BST), SrTiO3 (STO), SrBi2Ta2O9 (SBT), BaTiO3 (BTO), (Bi1-xLax) 4Ti3O12 (BLT), or other ferroelectric material fabricated between two conductive electrodes to form a ferroelectric capacitor $C_{FE}$.

The data memory cells 106a–106d of FIG. 3A and the contents thereof are accessed during read, restore, and write operations via the array bitlines BL1 and BL1' through activation of the wordline and plateline signals WL1–WL512 and PL1–PL512, respectively. The ferroelectric capacitor $C_{FE}1$ of the first row is coupled with the bitline BL1 via the first wordline signal WL1 and an access transistor 110a, and the cell capacitor $C_{FE}1$ is accessed via activation of a cell plateline signal (e.g., pulse) PL1 from the control system 122 in FIG. 3F. In the illustrated implementation, the array bitline is precharged to ground (e.g., Vss or 0V) and the plate line signal is activating by bringing the plateline PL1 to Vdd or some other positive voltage, thereby creating a voltage across the cell capacitor $C_{FE}1$. In other implementations, the plateline signal can be activated by any signal on the plateline PL1 or combination of plateline and bitline control signals by which a voltage is created across the cell capacitor $C_{FE}1$ (e.g., the plateline voltage is different than the bitline voltage) to access (e.g., read) the data thereof. Thereafter, the plateline signal PL1 is deactivated (e.g., before or after enabling the sense amp) by bringing the plateline voltage at the second cell capacitor terminal back to about it's original value. Other implementations are possible, for example, wherein the plateline and bitline voltages are initially at the same voltage level (e.g., bitline and plateline initially precharged to Vss), after which the bitline is pulsed high or low to a different voltage to create the cell capacitor voltage, wherein such implementations are also deemed to involve 'activating' a plateline signal, even where the plateline voltage itself does not initially change. Thus, the plateline signal activation comprises any signal changes by which a voltage is created across the ferroelectric target cell capacitor, wherein all such variant implementations are contemplated as falling within the scope of the present invention and the appended claims.

During the read operation, a reference voltage is supplied to the complementary bitline BL1' via reference generator 108' by charging a reference capacitor Cref to a voltage Vddref (FIG. 3C) according to a signal RFCOL from the control system 122. The charged reference capacitor Cref is then selectively coupled to one of the complementary bitlines BL1 or BL1' according to control signals RFWL and RFWL', respectively, from the control system 122. The corresponding sense amp 112 then senses the differential voltage on the bitline pair BL1/BL1' to ascertain the data state stored in the target cell 106a. The data may then be transferred to I/O circuitry, and is also written back into the target cell.

During a read operation, the sense amp 112 and the sense amp bitlines SABL/SABL' thereof are coupled with the array bitlines BL1/BL1' via transistors 124a and 124b in a TGATE select circuit 124 according to a signal TG1 from the control system 122 (FIG. 3C). The bitlines BL1/BL1' are precharged to ground via a precharge circuit 114a, 114b of the sense amp 112 according to signal a PRC from the control system 122. The sense amp 112 along the first column bitlines BL1/BL1' comprises NMOS transistors MN0, MN1, and MN2 as well as PMOS transistors MP0, MP1, and MP2. The sense amp 112 is enabled using sense amp enable signals SE and SE' provided by the control circuit 122 to sense amp transistors MN2 and MP2, respectively. An IO select circuit comprising transistors 120a and 120b selectively couples the sense amp bitlines SABL1/SABL1' with local IO lines LIO and LIO', respectively, according to a local IO select control signal LIOS from the control circuit 122.

As illustrated in FIG. 3B, the zero cancellation system 130 comprises first zero cancellation circuit 130a with a ferroelectric zero cancellation capacitor C1 and a zero cancellation transistor 132 that selectively couples the capacitor C1 with the bitline BL1 according to a zero cancellation wordline signal ZCWL. The system 130 further provides a ferroelectric zero cancellation capacitor C1' and a zero cancellation transistor 132' to coupled C1' with the complementary BL1' according to a control signal ZCWL'. The control system 122 further provides zero cancellation plateline signals ZCPL and ZCPL' to the other terminals of the zero cancellation capacitors C1 and C', respectively, as illustrated below in FIGS. 3D and 3E. The system 130 may further provide for discharging the first terminals of the zero cancellation capacitors C1 and C1' to ground (e.g., nodes DSN and DSN'), using discharge transistors 136 and 136' according to discharge signals ZCRG and ZCRG', respectively, from the control system 122.

Referring also to FIGS. 3D and 3E, waveform diagrams 150 and 160 are illustrated for read operations using pulse sensing and step sensing, respectively, in the first column of the exemplary device 102. As can be seen in the diagrams 150 and 160, the control system 122 activates the cell plateline and wordline signals to the array 104 as well as the zero cancellation wordline signals ZCWL/ZCWL' to the zero cancellation switching device for coupling first terminals of the zero cancellation capacitors C1/C1' with the array bitlines BL1/BL1', respectively. In addition, the control system 122 provides a negative pulse ZCPL/ZCPL' to second terminals of the capacitors C1/C1' while the cell plateline signals PL1/PL1' are provided to a target ferroelectric cell capacitor $C_{FE}$.

In the example of FIG. 3D, cell data is read from the cell 106a along the first wordline WL1 and the first bitline BL1. The control system 122 raises ZCWL to couple the zero cancellation capacitor C1 to the array bitline BL1, and also raises the zero cancellation plateline signal ZCPL to a first voltage level (e.g., Vdd in this example). While the ZCPL signal is raised, the PRC is ON. Raising the ZCPL signal causes the BL1 voltage to rise, but since the PRC is ON, the BL1 voltage discharges to Vss. Subsequently the PRC is turned OFF to float the BL1 before activating the cell via the wordline WL1. The cell wordline WL1 is then brought high, thereby coupling the target capacitor $C_{FE}1$ in the cell 106a with the bitline BL1. The cell plateline signal PL1 is then activated by providing a positive pulse on the cell plateline PL1, thereby creating a voltage across the ferroelectric cell capacitor $C_{FE}1$. This causes the bitline voltage on BL1 to rise, wherein the bitline voltage is dependent upon the data state value stored in the cell capacitor $C_{FE}1$. In the illustrated example, the cell plateline PL1 need only be raised to Vdd, wherein the zero cancellation system 130 of the invention lowers the bitline voltage on BL1, whereby no voltage boost circuits are needed for generating the cell plateline pulse PL1.

While the cell plateline signal PL1 is activated (e.g., high in this example), the control circuit 122 provides a negative going pulse ZCPL to the zero cancellation capacitor C1. In the illustrated implementation, the zero cancellation plateline signal ZCPL comprises a first voltage level Vdd during a first time period, a second voltage level (e.g., ground or Vss) during a second time period, and a third voltage level Vdd during a third time period, wherein the first and third voltage levels are greater than the second voltage level. Any negative pulse may be provided to the capacitor C1 to selectively reduce the bitline voltage on BL1 within the scope of the invention, wherein the first and third voltage levels are equal and the first, second, and third voltage levels are all positive in the illustrated example.

As ZCPL is brought low, negative charge is introduced through the capacitor C1 into the bitline BL1 and the bitline voltage at BL1 is decreased, as shown in the waveform diagram 150 of FIG. 3D. This reduction in the bitline voltage BL1 advantageously increases the voltage applied across the ferroelectric cell capacitor $C_{FE}1$ (e.g., the voltage across $C_{FE}1$ at any time is the cell plateline voltage PL1 minus the bitline voltage BL1), wherein the reduced bitline voltage depends upon the data stored in the target cell 106a. Thus, compared with the conventional device 2 above, the invention allows use of a lower cell plateline voltage PL1 (e.g., Vdd in this example), whereby no voltage boost circuitry is needed. The ZCPL signal is then brought high while the cell plateline signal PL1 remains activated (e.g., high), thereby introducing a positive charge back into to the bitline BL1. In the illustrated example where the first and third voltage levels of the signal ZCPL are the same, the positive charge is generally the same as the negative charge provided when the ZCPL signal was initially lowered, although this condition is not required within the scope of the invention. Any small variation due to process, supply voltage, temperature etc. in the ZCPL negative pulse amplitude and/or in the zero cancellation capacitor value C1 do not significantly impact the final signal value on the BL1. However, the final signal value on the bitline BL1 will be impacted because more switched charge will flow from the ferroelectric cell capacitor $C_{FE}1$ due to the increased voltage across the ferroelectric cell capacitor $C_{FE}1$ compared to a case when the ZCPL is not pulsed negatively. In the example above, the first and the third pre-determined voltage levels are Vdd and the second voltage level is Vss or 0V. When the cell plate line is high at Vdd and the ZCPL signal is low at Vss, for a case where zero cancellation capacitor C1 has same value as that for the cell capacitor $C_{FE}1$, the BL1 DATA "0" voltage level is 0V. In that case, a full Vdd is applied across the cell capacitor $C_{FE}1$ by operation of the cell plateline pulse PL1 and the zero cancellation system. In this example, the BL1 DATA "0" signal has been lowered or cancelled completely during the time the cell plateline signal PL1 is at Vdd and the ZCPL signal is at Vss. In other cases, the lowered BL1 DATA "0" can be negative, zero, or a positive voltage depending upon the cell plate line PL1 high voltage level, the ZCPL negative pulse voltage amplitude, the cell capacitance $C_{FE}1$, and the zero cancellation capacitor C1 values. In the case where the BL1 voltage is negative when the cell plateline PL1 is high at Vdd, the voltage across the cell capacitor $C_{FE}1$ is raised to greater than Vdd, which may be advantageous in certain applications, provided the circuit reliability is not adversely impacted. Another consideration is that such a negative voltage on the bitline may forward bias diffusion junctions, whereby the bitline may accumulate charge from surrounding circuit elements if the bitline voltage exceeds a few hundred mV, which is not typically desired.

During the sensing of the cell 106a, a reference voltage is applied to the complementary bitline BL1', for example, using reference generator 108' and switch 108a in FIG. 3C. This creates a differential voltage at the input terminals of the sense amp 112 (e.g., sense amp bitlines SABL1/SABL1'), the polarity of which indicates the data stored in the target data cell 106a. In the pulse sensing example of FIG. 3D, the cell plateline PL1 is then brought low (e.g., deactivated) and the sense amp is thereafter enabled via the SE signal to begin sensing operation. Alternatively, step sensing may be employed as shown in the diagram 160 of FIG. 3E, wherein the sense amp enable signal SE is brought high prior to deactivating the plateline PL1 signal (e.g., prior to bringing PL1 low. As illustrated in FIGS. 3D and 3E, once the sense amp enable signal SE is raised, the sense amp 112 clamps the bitlines BL1/BL1' to Vdd and 0 V, depending on the cell data state, and thereafter the local I/O signal LIOS can be asserted to provide the sensed data to I/O circuitry (not shown).

In the illustrated implementation, the control system 122 raises the ZCPL signal high, and discharges the array bitline and the internal node DSN of the zero cancellation circuit 130a by asserting the PRC signal to the transistor 114a, before prior to bringing the cell wordline WL1 high. In another possible implementation, the discharge transistor 136 is provided in the zero cancellation circuit 130a (FIG. 3B) to selectively couple the first zero cancellation capacitor terminal (e.g., node DSN) to zero volts according to a zero cancellation discharge signal ZCRG from the control system 122. In this case, the ZCRG signal is provided prior to the ZCWL signal so that the zero cancellation capacitor C1 is not coupled to the array bitline BL1 until the node DSN is discharged, thereby allowing the cell wordline WL1 to go on sooner, wherein the ZCWL may be asserted after the cell plateline signal PL1 is raised.

Figure 3G:
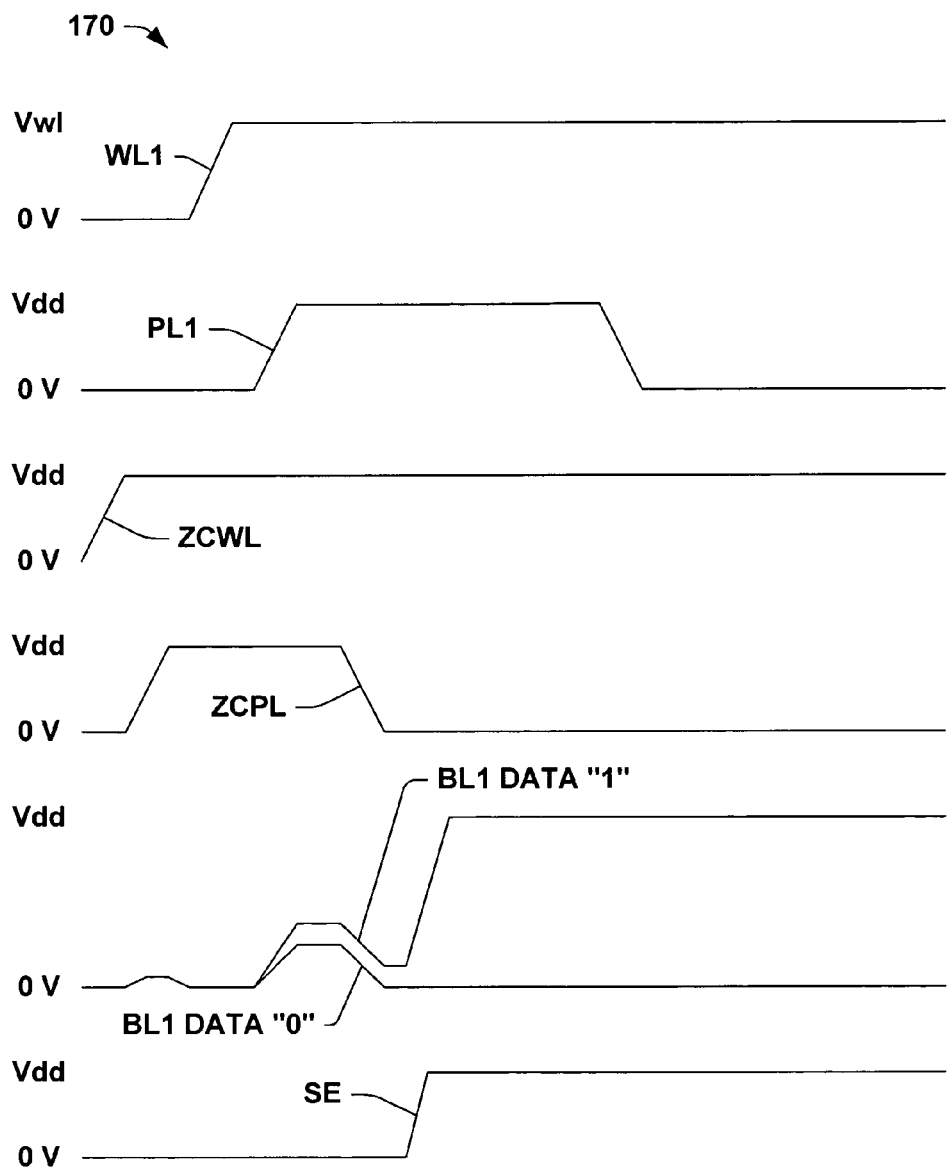

Referring now to FIG. 3G, another possible implementation is illustrated in which the ZCPL signal is initially high (e.g., at a first voltage level) when the cell plateline signal PL1 is activated (e.g., brought high), after which the ZCPL signal is lowered to a second voltage level (e.g., while PL1 remains activated high) and results in lowering of the bitline voltage. In this example, the sense amp is enabled via the SE signal while the cell plateline PL1 is activated and while the zero cancellation plateline ZCPL is low. In this example, the ZCPL need not be raised prior to sensing, wherein the reference voltage on the complementary array bitline BL1' may be adjusted accordingly to a level between the lowered data bitline voltages on BL1 for the "1" and "0" states. The approach of FIG. 3G may save time in read operations compared with those of FIGS. 3E–3F because the SE is activated sooner. However, the approach of FIG. 3G may add additional offsets in the signal levels and degrade the sensing signal margins for the sense amp after repeated accesses of the memory chip over time. For instance, where the zero cancellation capacitor is made from ferroelectric material, then the well known ferroelectric material characteristics known as fatigue and imprints can change the zero cancellation capacitor properties including its capacitance value and degrade the signal margins over time. In such a ferroelectric memory array, matching of zero cancellation capacitor values in different columns may be required to avoid degradation in the signal margins. Also the approach of FIG. 3G may be sensitive to the ZCPL negative pulse amplitude, which can change with supply voltage and temperature. However, another advantage of the above scheme of FIG. 3G is that if the signal BL1 DATA "0" is a negative voltage and signal BL1 DATA "1" is a positive voltage when the PL1 is active high and ZCPL is low at the second voltage, the reference voltage 0V or Vss for the complementary bitline BL1' can be used to simplify the reference generation circuit.

Figure 4:
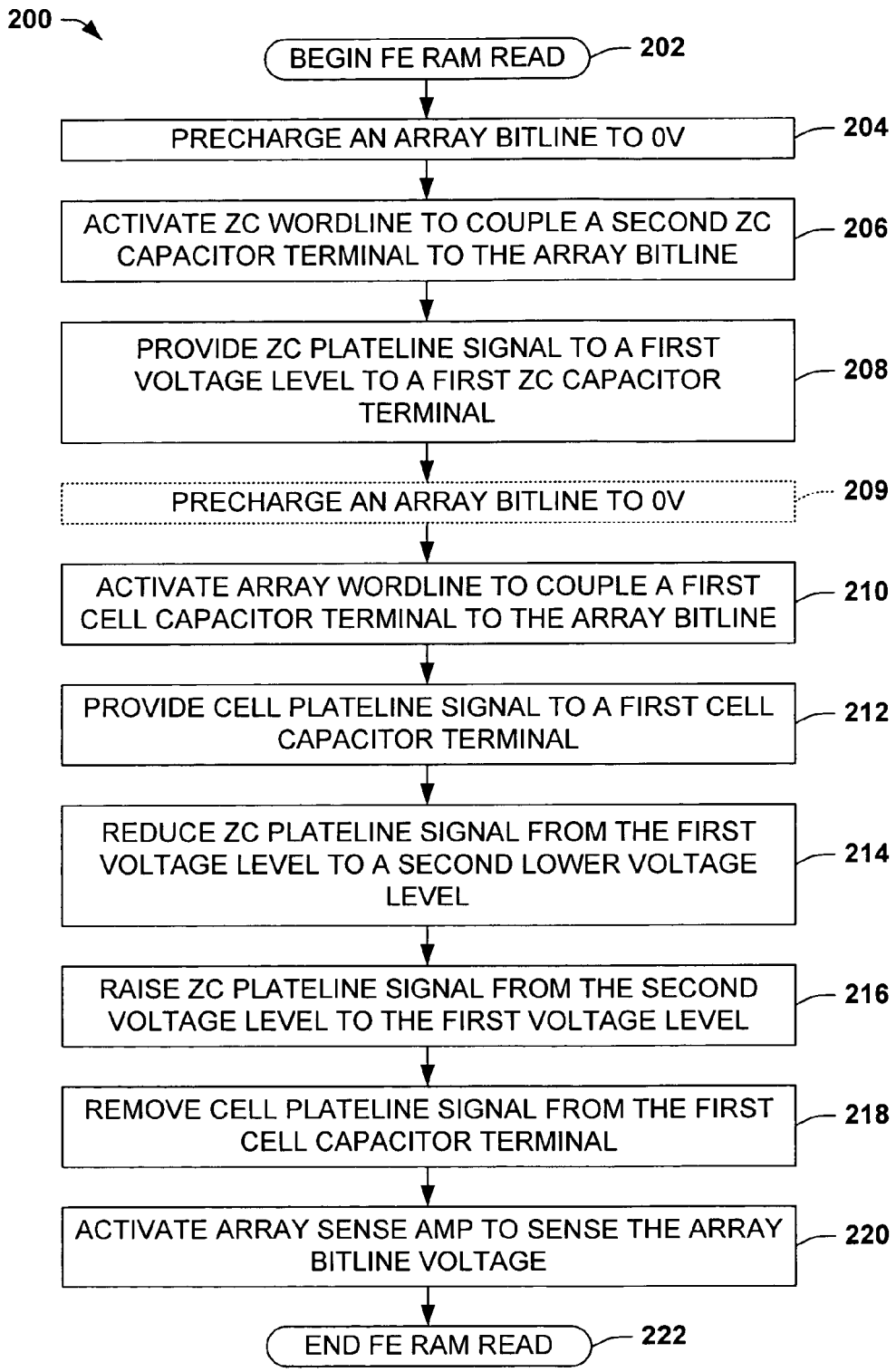
FIG. 4 is a flow diagram illustrating an exemplary method of reading a ferroelectric memory cell in accordance with the invention.

Referring now to FIG. 4, another aspect of the invention provides methods for reading ferroelectric memory data, wherein an exemplary method 200 is illustrated according to this aspect of the invention. Although the method 200 is illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the devices and systems illustrated and described herein as well as in association with other structures not illustrated.

Beginning at 202, an array bitline in a ferroelectric data array is precharged at 204 to a first voltage. For example, in the illustrated device 102 above, the data bitline BL1 is precharged to ground (e.g., 0 V) via assertion of the PRC signal by the control system 122. At 206, a first terminal of a zero cancellation capacitor is coupled to an array bitline by activating a zero cancellation wordline signal (e.g., ZCWL). At 208, a zero cancellation plateline signal (e.g., ZCPL) is applied to the zero cancellation capacitor at a first voltage level (e.g., Vdd in the above example). At 209, the array bitline may again be precharged to 0V (e.g., Vss). At 210, a ferroelectric cell capacitor is coupled to the bitline by activating a cell wordline signal (e.g., WL1). At 212, a cell plateline signal is activated to create a voltage across the ferroelectric cell capacitor (e.g., PL1 is brought high in the above example).

In accordance with an aspect of the invention, the zero cancellation plateline signal (e.g., ZCPL) is then lowered to a second voltage level at 214, thereby introducing a negative charge onto the array bitline while the cell plateline signal (e.g., PL1) remains activated high. This negative charge reduces the bitline voltage, whereby a higher effective voltage is applied to the ferroelectric cell capacitor (e.g., plateline voltage—bitline voltage). Thereafter at 216, the zero cancellation plateline signal is raised to the original first voltage level, by which a positive charge is provided to the array bitline. The cell plateline signal (e.g., PL1) is then deactivated at 218 (e.g., brought back to about it's initial level 0 V), and an array sense amp is enabled or activated at 220 to sense the array bitline voltage (e.g., to sense the data state read from the target array cell). The data may then be transferred to I/O circuitry and is also rewritten to the target cell and the read operation method 200 ends at 222.

In the illustrated example, the first and second voltage levels are both positive or the second voltage can be 0 V, although one or both of these voltage levels may be negative within the scope of the invention. In addition, the above example raises the zero cancellation plateline signal (e.g., ZCPL) from the second voltage level back to the original (e.g., first) voltage level at 216. However, other implementations are possible, for example, wherein the ZCPL is lowered to the second voltage before or concurrently with the cell plateline PL being activated. In another variation, the ZCPL may be raised concurrently with or after the cell plateline PL is deactivated (e.g., brought low). In another possible implementation, the zero cancellation plateline signal can be raised at 216 to a different third voltage level, which is greater than the second level, but need not be the same as the first voltage level. Furthermore, the methods of the invention may be employed in systems using pulse sensing or any other sensing technique, wherein the sense amp may be enabled after, or concurrently with the cell plateline (e.g., PL1) being deactivated. Furthermore, the methods of the invention may be employed in systems using step sensing or any other sensing technique, wherein the sense amp may be enabled while the cell plateline PL is activated and the ZCPL is at the second voltage or at a third voltage. All such variants are contemplated as falling within the scope of the invention and the appended claims. Moreover, the methods and systems of the invention find utility in single transistor-single capacitor (1T1C) circuits and other memory cell architectures (e.g., 2T2C, etc.), wherein the invention is not limited to the illustrated examples.

In another aspect of the invention, the method may also comprise coupling the first zero cancellation capacitor terminal to zero volts before coupling the first zero cancellation capacitor terminal to the bitline, for example, using the discharge transistor 136 of FIG. 3B above via a ZCRG signal from the control system 122. The invention could also be used in ferro-electric latches to read latch states, and also in non-volatile SRAM devices involving ferro-electric capacitors used to provide non-volatility to the SRAM. Although these or other circuits may use different terminology to describe various circuits elements for similar functions as described above for FeRAM arrays, nevertheless they fall within the scope of this invention. The words 0V, zero volts, Vss and ground are all inter-changeable.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A method of reading data from a ferroelectric memory cell, the method comprising:
   coupling a first ferroelectric cell capacitor terminal to an array bitline;
   activating a cell plateline signal to a second ferroelectric cell capacitor terminal to provide a voltage across the ferroelectric cell capacitor;
   coupling a first zero cancellation capacitor terminal to the array bitline; and
   providing a zero cancellation plateline signal to a second zero cancellation capacitor terminal while the cell plateline signal is activated, the zero cancellation plateline signal comprising a first pre-determined voltage level during a first time period and a second pre-determined voltage level during a second time period, wherein the first voltage level is greater than the second voltage level.

2. The method of claim 1, further comprising sensing a voltage on the array bitline after the second time period.

3. The method of claim 1, wherein the second voltage level is ground and first voltage is Vdd.

4. The method of claim 1, wherein the second voltage level is negative.

5. The method of claim 1, wherein the zero cancellation capacitor is substantially identical to the ferroelectric cell capacitor.

6. The method of claim 1, wherein the zero cancellation capacitor is identical to the ferroelectric cell capacitor.

7. The method of claim 1, further comprising precharging the array bitline to a third pre-determined voltage level before coupling the first ferroelectric cell capacitor terminal to the array bitline.

8. The method of claim 7, wherein the third pre-determined voltage is ground.

9. The method of claim 1, further comprising coupling the first zero cancellation capacitor terminal to a fourth pre-determined voltage level while the second zero cancellation capacitor terminal is coupled to the first pre-determined voltage level before coupling the first zero cancellation capacitor terminal to the array bitline.

10. The method of claim 9, wherein the pre-determined fourth voltage level is ground.

11. The method of claim 1, further comprising precharging the array bitline to a third pre-determined voltage level before coupling the first ferroelectric cell capacitor terminal to the array bitline, further comprising coupling the first zero cancellation capacitor terminal to the third pre-determined voltage level while the second zero cancellation capacitor terminal is coupled to the first pre-determined voltage level before coupling the first zero cancellation capacitor terminal to the array bitline.

12. The method of claim 11, wherein the third pre-determined voltage is ground.

13. The method of claim 1, further comprising precharging the array bitline to a third pre-determined voltage level during pre-charge before coupling the first ferroelectric cell capacitor terminal to the array bitline, further comprising coupling the first zero cancellation capacitor terminal to the array bitline during the pre-charge while the second zero cancellation capacitor terminal is coupled to the first pre-determined voltage level.

14. The method of claim 13, wherein the third pre-determined voltage is ground.

15. The method of claim 1, further comprising coupling a reference voltage to a complementary array bitline, wherein the reference voltage is zero volts.

16. A method of reading data from a ferroelectric memory cell, the method comprising:
   coupling a first ferroelectric cell capacitor terminal to an array bitline;

activating a cell plateline signal to a second ferroelectric cell capacitor terminal to provide a voltage across the ferroelectric cell capacitor;

coupling a first zero cancellation capacitor terminal to the array bitline; and providing a zero cancellation plateline signal to a second zero cancellation capacitor terminal while the cell plateline signal is activated, the zero cancellation plateline signal comprising a first voltage level during a first time period, a second voltage level during a second time period, and a third voltage level during a third time period, wherein the first and third voltage levels are greater than the second voltage level.

17. The method of claim 16, wherein the first voltage level, the second voltage level and the third voltage level are pre-determined voltage levels.

18. The method of claim 16, wherein the first and third voltage levels are equal.

19. The method of claim 16, wherein the first, second, and third voltage levels are positive.

20. The method of claim 16, further comprising sensing a voltage on the array bitline after the third time period.

21. The method of claim 16, wherein the second voltage level is ground and first voltage is Vdd.

22. The method of claim 16, wherein the second voltage level is negative.

23. The method of claim 16, wherein the zero cancellation capacitor is substantially identical to the ferroelectric cell capacitor.

24. The method of claim 16, wherein the zero cancellation capacitor is identical to the ferroelectric cell capacitor.

25. The method of claim 16, further comprising deactivating the cell plateline signal before sensing the voltage on the array bitline.

26. The method of claim 16, further comprising precharging the array bitline to a pre-determined voltage level before coupling the first ferroelectric cell capacitor terminal to the array bitline.

27. The method of claim 26, wherein the pre-determined voltage level is ground.

28. The method of claim 16, further comprising coupling the first zero cancellation capacitor terminal to a pre-determined voltage level while the second zero cancellation capacitor terminal is coupled to the first voltage level before coupling the first zero cancellation capacitor terminal to the array bitline.

29. The method of claim 28, wherein the pre-determined voltage level is ground.

30. The method of claim 16, further comprising precharging the array bitline to a pre-determined voltage level before coupling the first ferroelectric cell capacitor terminal to the array bitline, further comprising coupling the first zero cancellation capacitor terminal to the pre-determined level while the second zero cancellation capacitor terminal is coupled to the first voltage level before coupling the first zero cancellation capacitor terminal to the array bitline.

31. The method of claim 30, wherein the pre-determined voltage level is ground.

32. The method of claim 16, further comprising precharging the array bitline to a pre-determined voltage level during a pre-charge period before coupling the first ferroelectric cell capacitor terminal to the array bitline, further comprising coupling the first zero cancellation capacitor terminal to the array bitline during the pre-charge period while the second zero cancellation capacitor terminal is coupled to the first voltage level.

33. The method of claim 32, wherein the pre-determined voltage level is ground.

34. A system for reading data using reduced plateline voltages in a ferroelectric memory device, the system comprising:

a zero cancellation capacitor having first and second terminals;

a zero cancellation switching device coupled with the zero cancellation capacitor, the zero cancellation switching device selectively coupling the first zero cancellation capacitor terminal with an array bitline according to a zero cancellation wordline signal; and a control system coupled with the zero cancellation capacitor and the zero cancellation switching device, the control system providing the zero cancellation wordline signal to the zero cancellation switching device and providing a negative pulse of a pre-determined magnitude to the second zero cancellation capacitor terminal while a cell plateline signal is activated to create a voltage across a target ferroelectric cell capacitor.

35. The system of claim 34, wherein the control system provides a zero cancellation plateline signal to the second zero cancellation capacitor terminal while the cell plateline signal is activated, the zero cancellation plateline signal comprising a first pre-determined voltage level during a first time period and a second pre-determined voltage level during a second time period, wherein the first pre-determined voltage level is greater than the second pre-determined voltage level.

36. The system of claim 35, wherein the zero cancellation plateline signal further comprises a third pre-determined voltage level during a third time period after the second time period, wherein the third pre-determined voltage level is greater than the second pre-determined voltage level.

37. The system of claim 36, wherein the first and third pre-determined voltage levels are equal.

38. The system of claim 36, wherein the first, second, and third pre-determined voltage levels are positive.

39. The system of claim 34, further comprising a zero cancellation discharge switching device coupled with the zero cancellation capacitor, the zero cancellation discharge switching device selectively coupling the first zero cancellation capacitor terminal to a pre-determined voltage level according to a zero cancellation discharge signal from the control system.

40. The system of claim 39, wherein the pre-determined voltage level is ground.

41. The system of claim 34, wherein the zero cancellation capacitor is a ferroelectric capacitor.

42. A ferroelectric memory device, comprising:

an array of ferroelectric memory cells arranged in rows and columns, the cells individually comprising at least one ferroelectric cell capacitor having first and second terminals and at least one cell transistor adapted to selectively couple the first cell capacitor terminal to one of a pair of array bitlines associated with an array column according to an array wordline, wherein rows of the memory cells are coupled with a corresponding wordline;

a zero cancellation system coupled with the array, the zero cancellation system comprising a plurality of zero cancellation circuits individually coupled with the array bitlines, the zero cancellation circuits individually comprising a zero cancellation capacitor having first and second terminals, and a zero cancellation switching device coupled with the zero cancellation capacitor, the zero cancellation switching device selectively coupling the first zero cancellation capacitor terminal with an array bitline according to a zero cancellation wordline signal; and a control system coupled with the zero cancellation capacitor and the zero cancellation switching device, the control system providing the zero cancellation wordline signal to the zero cancellation switching device and providing a negative pulse of a pre-determined magnitude to the second zero cancellation capacitor terminal while a cell plateline signal is activated to provide a voltage across a target ferroelectric cell capacitor.

43. The ferroelectric memory device of claim 42, wherein the control system provides a zero cancellation plateline signal to the second zero cancellation capacitor terminal while the cell plateline signal is activated, the zero cancellation plateline signal comprising a first pre-determined voltage level during a first time period and a second pre-determined voltage level during a second time period, wherein the first pre-determined voltage level is greater than the second pre-determined voltage level.

44. The ferroelectric memory device of claim 43, wherein the zero cancellation plateline signal further comprises a third pre-determined voltage level during a third time period after the second time period, wherein the third pre-determined voltage level is greater than the second voltage level.

45. The ferroelectric memory device of claim 44, wherein the first and third pre-determined voltage levels are equal.

46. The ferroelectric memory device of claim 44, wherein the first, second, and third pre-determined voltage levels are positive.

47. The ferroelectric memory device of claim 42, further comprising a zero cancellation discharge switching device coupled with the zero cancellation capacitor, the zero cancellation discharge switching device selectively coupling the first zero cancellation capacitor terminal to a pre-determined voltage level according to a zero cancellation discharge signal from the control system.

48. The system of claim 47, wherein the pre-determined voltage level is ground.

49. The ferroelectric memory device of claim 42, wherein the zero cancellation capacitor is a ferroelectric capacitor.

\* \* \* \* \*